US009829530B2

(12) United States Patent
Koch

(10) Patent No.: US 9,829,530 B2
(45) Date of Patent: Nov. 28, 2017

(54) METHOD FOR ADAPTING AN ARC SENSOR

(75) Inventor: Michael Koch, Vienna (AT)

(73) Assignee: EATON INDUSTRIES (AUSTRIA) GMBH, Schrems (AT)

( * ) Notice: Subject to any disclaimer, the term of this patent is extended or adjusted under 35 U.S.C. 154(b) by 670 days.

(21) Appl. No.: 14/234,667

(22) PCT Filed: Jul. 26, 2012

(86) PCT No.: PCT/EP2012/064733
§ 371 (c)(1),
(2), (4) Date: Mar. 28, 2014

(87) PCT Pub. No.: WO2013/014249
PCT Pub. Date: Jan. 31, 2013

(65) Prior Publication Data
US 2014/0198413 A1    Jul. 17, 2014

Related U.S. Application Data

(60) Provisional application No. 61/511,696, filed on Jul. 26, 2011.

(30) Foreign Application Priority Data

Jul. 26, 2011  (AT) .................. A1094/2011

(51) Int. Cl.
*G01R 31/12* (2006.01)
*H02H 1/00* (2006.01)
(Continued)

(52) U.S. Cl.
CPC ..... *G01R 31/1227* (2013.01); *G01R 31/3272* (2013.01); *G01R 35/00* (2013.01);
(Continued)

(58) Field of Classification Search
CPC ........ H01H 33/027; H01H 33/04; H01H 9/30; H01H 9/50; H02H 1/0015; H02H 3/006; G01R 31/1227; G01R 31/3272
See application file for complete search history.

(56) References Cited

U.S. PATENT DOCUMENTS 6,259,996 B1 * 7/2001 Haun ................... H02H 1/0015
361/63
6,300,766 B1 * 10/2001 Schmalz .............. H02H 1/0015
324/522

(Continued)

FOREIGN PATENT DOCUMENTS

DE   19758085 A1   7/1999
EP    1439396 A2   7/2004
(Continued)

OTHER PUBLICATIONS

Hao, et al., "Partial Discharge Source Discrimination using a Support Vector Machine", IEEE Transactions on Dielectrics and Electrical Insulation, vol. 17, Nr. 1, Feb. 2010, pp. 189-197.

*Primary Examiner* — Stephen W Jackson
*Assistant Examiner* — Christopher Clark
(74) *Attorney, Agent, or Firm* — Leydig, Voit & Mayer, Ltd.

(57) ABSTRACT

In a method for adapting an arc sensor (35) to a position in an electrical installation system, according to the invention a specifiable number of specifiable arcs are simulated and/or produced at least at a first position in the installation system, wherein after each simulated or produced arc, at least one current curve and/or voltage curve is recorded in a measured-value recording unit (2), wherein at least one characteristic of the recorded current curves and/or voltage curves is determined and stored, and the arc sensor (35) is trained for the electrical installation system.

20 Claims, 4 Drawing Sheets

(51) Int. Cl.
  *G01R 31/327* (2006.01)
  *H02H 3/00* (2006.01)
  *G01R 35/00* (2006.01)
  *H01H 33/02* (2006.01)

(52) U.S. Cl.
  CPC ........ *H01H 33/027* (2013.01); *H02H 1/0015* (2013.01); *H02H 3/006* (2013.01); *G01R 31/12* (2013.01)

(56) References Cited

U.S. PATENT DOCUMENTS

| | | | |
|---|---|---|---|
| 6,400,258 B1* | 6/2002 | Parker | G01R 31/12 307/106 |
| 6,477,021 B1* | 11/2002 | Haun | H01H 71/125 324/520 |
| 6,525,918 B1* | 2/2003 | Alles | H02H 1/0015 361/87 |
| 8,284,534 B2* | 10/2012 | Guillot | H03K 17/0822 361/93.1 |
| 8,599,523 B1* | 12/2013 | Ostrovsky | G01R 31/025 361/45 |
| 2002/0118022 A1* | 8/2002 | Dring | G01R 31/14 324/536 |
| 2003/0011355 A1* | 1/2003 | Skerritt | G01R 1/203 324/117 R |
| 2004/0204873 A1 | 10/2004 | Freisleben et al. | |
| 2005/0286185 A1* | 12/2005 | Henson | H02H 1/0015 361/42 |
| 2006/0215335 A1* | 9/2006 | Deshpande | H02H 1/0015 361/42 |
| 2008/0084215 A1 | 4/2008 | Itten et al. | |
| 2010/0241372 A1 | 9/2010 | Xu et al. | |
| 2011/0249370 A1* | 10/2011 | Nayak | H02H 1/0015 361/42 |
| 2012/0044600 A1* | 2/2012 | Roscoe | H02H 1/0015 361/18 |
| 2012/0174961 A1* | 7/2012 | Larson | H01L 31/02021 136/246 |
| 2012/0275071 A1* | 11/2012 | Gutierrez | H02H 1/0015 361/42 |
| 2012/0323372 A1* | 12/2012 | Gattermann | G01M 13/04 700/275 |

FOREIGN PATENT DOCUMENTS

| WO | WO 9835237 A2 | 8/1998 |
|---|---|---|
| WO | WO 0118554 A1 | 3/2001 |

\* cited by examiner

METHOD FOR ADAPTING AN ARC SENSOR

CROSS-REFERENCE TO PRIOR APPLICATIONS

This application is a U.S. National Phase Application under 35 U.S.C. §371 of International Application No. PCT/EP2012/064733, filed on Jul. 26, 2012, and claims benefit to Austrian Patent Application No. AT A1094/2011, filed on Jul. 26, 2011 and to U.S. Provisional Patent Application No. 61/511,696, filed on Jul. 26, 2011. The International Application was published in German on Jan. 31, 2013 as WO 2013/014249 under PCT Article 21(2).

FIELD

The invention relates to a method for adapting an electric arc sensor at a position in an electrical installation system.

BACKGROUND

Methods for detecting electric arcs arising in an installation arrangement are known, during which an attempt is made to detect an electric arc with specific patterns in a frequency spectrum. During such a method, a current and/or voltage signal in the electrical installation arrangement is recorded and analysed. In doing so, it is known that some specific spectral parts are to be analysed as frequency ranges, and the current and/or voltage signal are to be examined with regards to the occurrence of specific patterns in this frequency range, in order to arrive at a conclusion on the occurrence of an electric arc. Such methods have proved to be disadvantageous in practice or unrealistic to implement, as these methods are often unable to detect actually occurring unsafe electric arcs as such, and consequently do not initiate a shutdown of the concerned network in the event of a fault. On the other hand, though, such methods often "detect" safe events as an "unsafe electric arc" and cause a shutdown of the network that cannot be justified from a safety perspective. Therefore, such known methods only ensure insufficient protection against the effects of unsafe electric arcs, and thus do not provide effective protection against fires caused by electric arcs. Furthermore, such methods lead to low network availability on account of inadvertent shutdowns. Due to these considerable disadvantages, such methods are often not used as several users perceive low network availability on account of an inadvertent shutdown as a deliberate disruptive event and negate the risks on account of electric arcs.

SUMMARY

In an embodiment, the present invention provides a method for adapting an electric arc sensor at a position in an electrical installation system. The method includes at least one of simulating and generating a specifiable number of specifiable electric arcs at a first position in the installation system. Each simulated or generated electric arc is recorded, using a data logging unit, in at least one curve that is at least one of a current curve and voltage curve. At least one characteristic of the at least one curve is determined and saved. The electric arc sensor is trained on the electrical installation system.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

In an embodiment, the invention provides a method for adapting an electric arc sensor at a position in an electrical installation system, with which the aforementioned disadvantages can be avoided and with which both high network availability as well as a high degree of safety against the effects of electric arcs that may arise is ensured.

High network availability as well as a high degree of safety against the effects of electric arcs that may arise can thus be achieved. It enables securely detecting electric arcs that may arise in the electrical installation arrangement and can be differentiated from other electrical events. In this manner, an electric arc sensor is directly trained in the electric environment to be protected or to be monitored for the effects of various electric arcs that may arise. This enables drawing on the actual effects of an electric arc arising under real conditions in the electrical installation arrangement to be protected for purposes of evaluation of electrical events, as well as for deciding whether at least a part of the electrical installation arrangement needs to be shut down due to an electrical event or not. In this manner, the measurable effects of electrical events that occur can be especially well evaluated or detected with regard to their cause as an electric arc event.

In another embodiment, the invention provides a method for protecting an electrical installation system from electric arcs, with which the disadvantages mentioned at the start can be avoided and with which both high network availability as well as a high degree of safety against the effects of electric arcs that may arise is ensured.

The aforementioned advantages can thus be achieved.

In a further embodiment, the invention provides an electric arc circuit breaker with at least one current sensor and/or voltage sensor for recording a current and/or voltage curve, as well as switching contacts for specifiable interruption of an electrical connection in an electrical installation system, with which the disadvantages mentioned at the start can be avoided and with which both high network availability as well as a high degree of safety against the effects of electric arcs that may arise is ensured.

Figure 1:
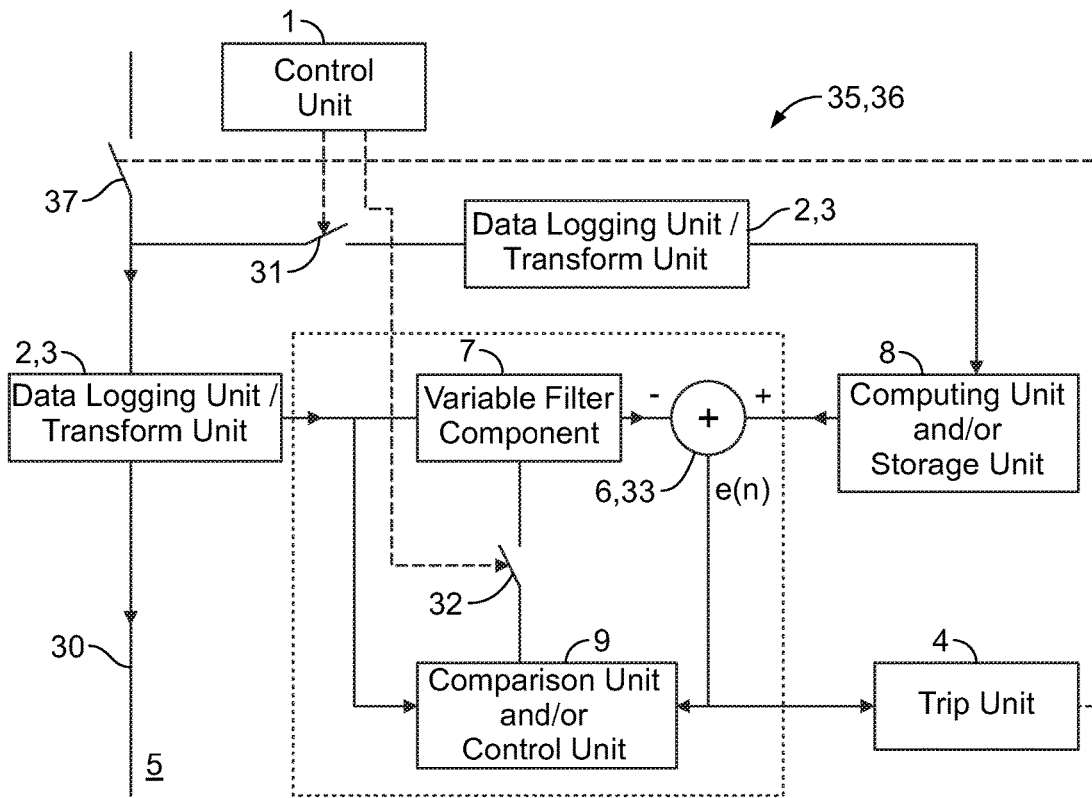
FIG. 1 shows a block diagram of a first arrangement for implementing a method according to an embodiment of the invention.
Figure 2:
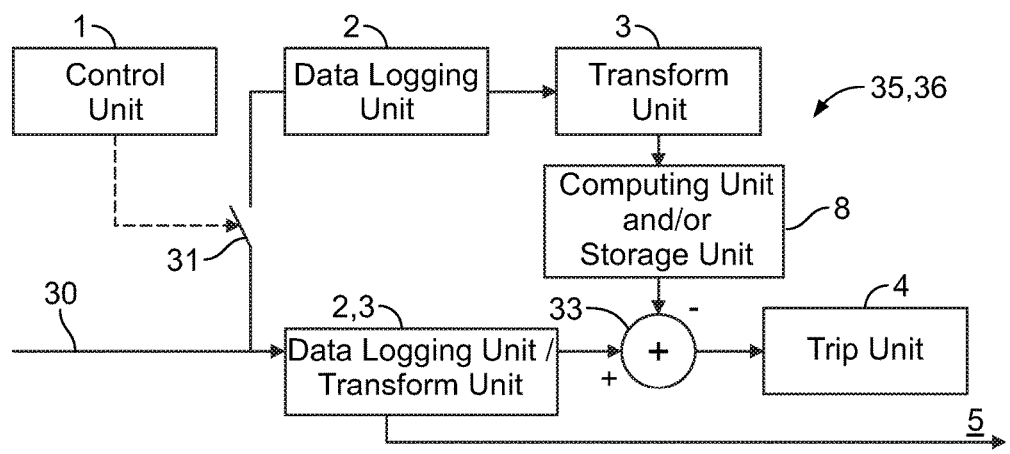
FIG. 2 shows a block diagram of a second arrangement for implementing a method according to an embodiment of the invention.

FIGS. 1 and 2 both show an arrangement for implementing a method for adapting an electric arc sensor 35 at a position in an electrical installation system, wherein a specifiable number of electric arcs are simulated and/or generated at least at a first position in the installation system, wherein after every simulated or generated electric arc, at least one current and/or voltage curve is recorded in a data logging unit, wherein at least one characteristic of the recorded current and/or voltage curves is determined and saved, and the electric arc sensor 35 is trained on the electrical installation system.

High network availability as well as a high degree of safety against the effects of electric arcs that may arise can thus be achieved. In this manner, electric arcs arising in the electrical installation arrangement can be safely detected and differentiated from other electrical events. An electric arc sensor 35 directly in the electrical environment to be protected or monitored is thus trained on the effects of various electric arcs that arise. This enables drawing on the actual effects of an electric arc arising under real-time conditions in the electrical installation arrangement to be protected for purposes of evaluating 15 of electrical events, as well as for deciding whether at least a part of the electrical installation arrangement needs to be shut down due to an electrical event or not. In this manner, the measurable effects of electrical events that occur can be especially well evaluated or detected with regard to their cause as an electric arc event.

The invention, according to an embodiment, focuses on a method by which an electric arc sensor 35 "learns" the effects or traces that an occurring electric arc causes or leaves behind in the actual electrical operational environment. For this purpose, an electric arc sensor 35 is arranged in the circuit at a point or position within the electrical installation arrangement, and becomes accustomed from this very position to detect which of the electrical effects occurring have been caused by an electric arc. Furthermore, the invention, according to an embodiment, includes a method for protecting an electrical installation system from electric arcs or their effects as well as an electric arc circuit breaker 36.

Initially, the method for adapting an electric arc sensor 35 in an electrical installation system as well as preferred embodiments themselves is described.

The electrical installation system is preferably any type of electrical circuit arrangement that is intended for and/or suited to being provided with and supplied electrical energy. In particular, the term includes installation system in the domain of housing technology.

An electric arc sensor 35 is preferably a device that is intended and/or designed for assigning an event or the measurable effects of an event within an electrical circuit arrangement or installation system in terms of cause to an electric arc, especially to a so-called unsafe one. An electric arc is designated as "unsafe" particularly if its power is sufficient to cause a fire in the environment of the electric arc in question. In addition to the power of the electric arc, the classification into unsafe and safe electric arcs is hence potentially also dependent on the environment in question and the combustibility or flammability of objects in the environment in question. A power loss of about 60 W at a point of failure is specified in the literature as fire-causing. Hence, it should preferably be planned that the actual environment of the electrical installation in system be considered and even electric arcs with low power be classified as unsafe electric arcs in a fire-sensitive environment.

Adapting means modifying the methods used or applied for detecting electric arcs to suit the actual electrical environment of the electric arc sensor 35. The electric arc sensor 35 therefore becomes accustomed to or is trained on the actual electrical environment. Preferred designs of this adaptation will be described in further detail.

It is intended that the electric arc sensor 35 be arranged in a position within the electrical installation arrangement.

In the method according to an embodiment of the invention, a specifiable number of specifiable electric arcs is simulated and/or generated at least at one position in the installation system. It should therefore preferably be planned that a specifiable number of specifiable electric arcs be likewise simulated and/or generated at several different positions. When generating a specifiable electric arc, it is planned that an electric arc will actually be caused at the first position 6 in question. Test devices for this purpose are already known. Simulating an electric arc preferably means injecting a broadband electrical signal, which reproduces the electrical effects in particular of an electric arc close to its location of occurrence.

The designation of specifiable electric arc refers both to the intensity or power loss of the simulated or generated electric arcs, as well as to the type of electric arc in terms of an electric arc on a serial conductor interruption or a parallel electric arc. It is intended that in each case, several electric arc events be generated and/or simulated at least at a first position. This will ensure the availability of statistically valid data for further evaluation of subsequent measurement results. This will enable improvement in the quality of the characteristics determined as opposed to individual measurements.

It is intended that after every simulated or generated electric arc, at least one current and/or voltage curve be recorded in or by a data logging unit 2. This includes recording the concerned current and/or voltage curve on the electric arc sensor 35 or through the electric arc sensor 35 itself. By generating or simulating the 20 electric arcs at the first position in the electrical installation system and the subsequent recording of the current and/or voltage curves at a—different—second position in the electrical installation system, at which the electric arc sensor 35 is also arranged for further monitoring of the electrical installation system, the electrical currents and/or voltages generated at the first position are—until they are recorded at the second position—subject to all the influences and effects of the intermediate parts of the electrical installation system, and will be altered by them. Such influences are, for instance, frequency-dependent transmission, reflection and/or damping of the broadband current and/or voltage curve, which occurs as a consequence of an electric arc, on the electrical conductors, at junctions, open ends and/or connected loads. The current and/or voltage signal ascertainable at the second position by the electric arc sensor 35 as a consequence of an electric arc can therefore have significant differences compared to the corresponding signal at the first position.

It is intended that a current and/or voltage curve be recorded, which will be recorded particularly as broadband. The upper threshold frequency in this case is preferably around 20 MHz. Wherein greater bandwidths and greater upper threshold frequencies can also be planned. Preferably, it is intended that in a data logging unit 2 at least one current sensor and/or a voltage sensor be arranged, which are designed for recording and displaying a time curve of the current in the electrical conductors 30 and/or the voltage between the conductors 30 as a time-dependent signal, wherein the display can be both in an analogue as well as in a discrete-value and/or discrete-time, particularly digital form.

Following the recording of the current and/or voltage curves, it is intended that at least one characteristic of the recorded current and/or voltage curves be determined and/or saved. Whenever the details in question mention that something is saved, an appropriate memory or a storage medium is intended, even when not explicitly mentioned. Characteristic shall preferably mean at last one formal or typical property of a current and/or voltage curve. In particular, characteristics shall preferably mean properties of the current and/or voltage curves caused by an electric arc, which enable significant differentiation from other current and/or voltage curves within the electrical installation system. Here, prior to the execution of the method in question, it can be intended that all loads, especially the least critical loads during whose operation electric arcs are likewise caused, such as DC machines with brushes, be commissioned and characteristics from the ascertained current and/or voltage curves be similarly determined. These load characteristics can be saved in order to detect even non-critical current and/or voltage curves as such with certainty during subsequent monitoring of the electrical installation system. By determining and saving at least one characteristic, it therefore becomes possible to assign with certainty and in line with the actual installation environment any electrical effects that may arise to unsafe or safe causes.

As already explained, any property of a current and/or voltage curve can be determined and/or saved as a characteristic, which should enable sufficient differentiation as to whether the cause is an unsafe electric arc or another, especially safe, electrical event.

Below are details of properties that are particularly preferred as a characteristic in the present context, wherein a combination of several of the detailed preferred characteristics can be present.

According to a preferred embodiment of the method in question, it is intended that at least one specifiable part of a time curve and/or an envelope curve of the current and/or voltage curve be determined and/or saved as at least one characteristic. This enables drawing on the duration of the event and a potential periodicity, as well as its frequency if necessary, for evaluating a current and/or voltage curve measured at a later time, which allows sufficient differentiation between electric arcs arising due to a fault, which occur aperiodically and unpredictably, and other, especially regularly occurring events. Furthermore, this enables determining or tracing the power at the fault location, and its consideration. This also enables detection of repeatedly occurring faults, as well as clearing up or extinguishing an electric arc.

In this context, it can be intended that at a number of unusual half-cycles of the current and/or voltage curves be determined and/or saved as at least one characteristic. Likewise, this enables effectively determining an electrical event as a fault, as they occur at random.

Furthermore, it can be intended that least one specifiable part of a frequency spectrum and/or an envelope curve of the frequency spectrum 30 of the current and/or voltage curve be determined and/or saved as at least one characteristic. By analysing the frequency range, unsafe electric arcs can be well recognised, as they show typical effects in current and/or voltage curves under typical frequency ranges. By involving the transmission characteristics of the actual electrical installation system, conclusions can now be drawn from the recorded current and/or voltage curves on the actual occurrence of an unsafe electric arc.

In doing so, it may be intended that an amplitude value be determined and/or saved in a specifiable frequency band as at least one characteristic. This has the advantage of high distinctiveness between unsafe electric arc events and other safe events. Furthermore, this leads to a technically simple implementation.

In addition, or alternatively, it can be intended that a phase shift of the current and/or voltage curve be determined and/or saved as at least one characteristic. The detection of a phase shift between the current and the voltage curve is technically simple to implement and enables narrowing down on an involved load or the type of fault location.

It is intended that the recorded current and/or voltage curves be examined and analysed with regard to at least one characteristic, especially at least one of the characteristics described above as preferred. For this purpose, any technical method can be intended for determining the—at least one—characteristic listed or the characteristic from the recorded current and/or voltage curves.

In particular, it is intended that the recorded current and/or voltage curves be analysed in a time range and/or an image range in a specifiable manner, in particular a frequency range, in order to determine at least one characteristic. In this regard, it is preferably intended that an electric arc detector includes a transform unit, particularly for implementing an FFT, a Gabor transform and/or a wavelet transform.

As already envisaged, it is preferably intended that several electric arcs be generated and/or simulated for every type of generated and/or simulated electric arc. This enables better detection and determining of the actual characteristics, as individual events generally have low validity.

Hence, in this context, it is preferably intended that a mean value and/or a standard deviation be determined from a specifiable number of determined characteristics. This enables determining a significantly more valid value in the form of a mean characteristic value, wherein by determining the variance or standard deviation, a grade is also made available for this mean characteristic value. During subsequent review of a recorded current and/or voltage curve with regard to their cause in an unsafe electric arc event, it is preferably intended that the currently recorded current and/or voltage curve be subject to the same mathematical methods used to determine the saved characteristic and the current and/or voltage curve thus processed be compared with the saved mean characteristic value, wherein a convergence of the newly processed current and/or voltage value within a specifiable interval around the mean characteristic value as compliance with the mean characteristic value can be seen. Here, the "width" of the interval in question can be a function of the standard deviation. This is due to there being a small interval being specified in case of a low standard deviation of the saved mean characteristic value, and a large interval being specified in case of a large standard deviation.

The manner in which the electric arc sensor 35 is adapted using the characteristics determined can be variously designed. Below are detailed descriptions of two preferred embodiments of an appropriately designed electric arc sensor 35 using FIGS. 1 and 2.

The arrangements described in each case are designed as electric arc circuit breakers 36 comprising an electric arc sensor 35, with at least one data logging unit 2 designed as a current sensor and/or voltage sensor for recording a current or voltage curve, as well as with switching contactors 37 for specifiable interruption of an electrical connection within an electrical installation system, wherein the electric arc circuit breaker 36 has an electrical circuit arrangement for carrying out a method for adapting an electric arc sensor 35 in an electrical installation system and/or a—subsequently described—method for protecting an electrical installation system from electric arcs, and the circuit arrangement is operatively connected at least indirectly with the switching contacts 37. The cited switching contacts 37 are only shown symbolically in the figures. Other components such as a sequential logic system or a switch lock that are generally provided in such breakers have not been shown. With regard to their design and arrangement, these components are preferably based on the appropriate components in circuit breakers and/or RCCBs. Preferably, it is intended that the electrical circuit arrangement comprise a microcontroller.

As already envisaged above, the invention, according to an embodiment, further comprises a method for protecting an electrical installation system from electric arcs, wherein at least one electric current and/or voltage curve is recorded, which is then compared with at least one characteristic determined according to the present method or evaluated with an algorithm—explained in further detail below—wherein in the event of specifiable convergence of at least one characteristic of the determined current and/or voltage curve with at least one determined characteristic or one specifiable threshold value, the electrical installation system is shut down. This enables comparing the current and/or voltage curves recoded for protecting the electrical installation system with the actual characteristics determined at the site where the current and/or voltage curves are recorded. In this way, electrical systems as well as their environment can be especially well protected from the damaging and unsafe effects of electric arcs, and high network availability can simultaneously be ensured by avoiding false tripping as far as possible.

Other preferred steps under the method are listed at the specified points under the description of especially preferred electric arc circuit breakers 36.

FIG. 1 shows a block diagram of a first arrangement for carrying out a method according to an embodiment of the invention or a first preferred embodiment of an electric arc circuit breaker 36 with an electric arc sensor 35.

The electric arc circuit breaker 36 in this case has an adaptive filter 6. For the purpose of adaptation, the control unit 1 that can have a microcontroller closes the first switch 31, through which at least one conductor 30 or a conductor pair of the electrical installation system is connected in the circuit with the data logging unit 2. It is intended that the control unit 1 have input methods or at least be temporarily connectable with such methods, say through an interface such as RS-232 and/or USB. This enables transmitting commands to the control unit, and the transition between various operating modes can be initiated. Furthermore, the control unit 1 is preferably connected—at least temporarily—with at least one display medium, through which a state can be monitored. This enables the requisite interaction when adapting the electric arc sensor 35. With regard to the type of electric arc, whether simulated or actually generated, whether the arc is a parallel or serial electric arc etc., as well as with regard to the number of electric arcs. The present details on control unit 1 are also applicable to the subsequently described embodiments according to FIGS. 2 and 3.

The data logging unit 2 determines the current and/or voltage curve as a function of time. For this purpose, the data logging unit 2 has suitable data loggers, wherein the determination of a digital current and/or voltage curve is especially intended. According to the preferred embodiment shown, the data logging unit 2 also comprises a transform unit 3, in which the current and/or voltage curve is transformed from a time range into an image range, especially the frequency range. The transformed signal is then available in a computing unit and/or storage unit 8. Here, it is intended that in the region of the computing and/or storage unit 8, at least one characteristic specified with regard to its type from the determined current and/or voltage curve or the transformed signal—available as a spectrum—is determined. This can also involve the determination of several characteristics. It is especially preferable that a mean value be formed from several characteristics determined on the basis of one and the same simulated or generated electric arc types.

It is now preferably intended that the adaptive filter 6 of an electric arc circuit breaker 36, especially according to FIG. 1, be set in an adaptation phase with the characteristics, especially with an appropriate mean value. Here, the same electrical signal is applied to the 13 adaptive filter 6 on both sides. For this purpose, another connection from the data logging unit 2 to a variable filter component 7 can be envisaged, or—as in FIG. 1—a second data logging unit 2, which is connected in the circuit with the variable filter component 7. The output of the variable filter component 7 is connected with an inverted input of the adaptive filter 6, whose non-inverting input is connected with the computing and/or storage unit 8. Preferably, only a single data logging unit 2 should be used, as the accuracy of the adaptation of the electric arc sensor would thus not be affected by negligible differences, such as varying noise, between two data logging units 2. The same also applies for the preferred implementation of the transform unit 3.

The output of the second data logging unit 2 is further connected with a so-called comparison and/or control unit 9. This is further connected with the output of the adaptive filter 6 itself. If the adaptive filter 6 is successfully adapted, the signal at the output of the adaptive filter 6 becomes very small, and in case of perfect—and in reality, unlikely—adaptation, zero. By comparing the output signal at the second data logging unit 2 with the output of the adaptive filter 6, at last a corrective value is determined with which the variable filter component 7 is adjusted such that the signal at the output of the adaptive filter 6 becomes very small, in particular zero. Here, it is preferably intended that the variable filter component 7 be adapted with the help of recursive mathematical methods or algorithms, which will be performed in the comparison and/or control unit 9.

With regard to the embodiment according to FIG. 1, the entire time curve and/or the entire spectrum of the current and/or voltage curve can at show one characteristic. However, it can also be intended that at least one of the aforementioned characteristics be determined in the data logging unit 2 or the transform unit 3, wherein in this case the variable filter is also applied only to—at least—this one characteristic.

According to the adaptation of the device appropriately described according to FIG. 1, subsequent operation will involve monitoring the current and/or voltage curve in at least one conductor for monitoring an electrical installation arrangement with regard to unsafe electric arcs that may arise, and processing by the data logging unit 2 or the transform unit 3 according to the determination of—at least—the one characteristic. Subsequently, the signal thus formed is filtered with the variable filter component 7 and fed to the inverted input of the adaptive filter 6, which is an adaptive filter 6 illustrated by a discrete addition unit 33 in FIG. 1 as a particularly preferred embodiment. The predetermined—at least one—characteristic saved in the computing and/or storage unit 8 is fed to the non-inverting input of the adaptive filter 6. The greater the correspondence between the saved characteristics and the newly determined "properties" of the current and/or voltage curve, the smaller the value at the output of the adaptive filter 6. In the trip unit 4, the output signal of the adaptive filter 6 is reviewed with regard to whether it falls short of a specifiable and saved comparison value. If the signal value at the output of the adaptive filter 6 falls short of the comparison value, the occurrence of an unsafe electric arc is assumed, whereupon the trip unit 4 initiates the opening of the isolating or switching contacts 37.

FIG. 2 shows a block diagram of a second arrangement for carrying out a method according to an embodiment of the invention or a second preferred embodiment of an electric arc circuit breaker 36 with an electric arc sensor 35. The isolating contacts.

With regard to the preferred embodiments of the individual components, please refer to the aforementioned explanations on FIG. 1. Only the functional interaction or circuit connections have been explained below.

An electric arc 35 according to the second embodiment has a control unit 1, two data logging units 2 as well as, preferably, two transform units 3, a computing and/or storage unit 8, a trip unit 4, a first switch 31, as well as an addition unit 33, which is designed pursuant to the preferred digital implementation of the electric arc sensor 35 according to FIG. 2 as a discrete addition unit 33.

The—at least one—conductor 30 is connected in the circuit with the data logging unit 2 through the first switch 31, which is controlled by the control unit. The data logging unit 2 is connected in the circuit with the transform unit 3, which in turn is itself connected with the computing and/or storage unit 8, whose output is located at an inverted input of the addition unit 33. Furthermore, a data logging unit 2, which also includes a transform unit 3, is arranged in the conductor 30; the output of the transform unit 3 is located at a non-inverting input of the addition unit 33. The output of the addition unit 33 is located at the trip unit 4.

During the adaptation of the electric arc sensor 35, the first switch 31 is closed by the control unit 1, and the specifiable electric arcs generated or simulated. During this process, current and/or voltage curve are recorded by the data logging unit 2 and transformed into the image range in the transform unit 3. From the spectrum thus determined, at least one characteristic is determined, which is saved in the computing and/or storage unit 8.

During the subsequent monitoring of the electrical installation system, the current and/or voltage curves each recorded by the other data logging unit 2 and processed by the transform unit 3 are applied to the non-inverting input of the addition unit 33. The greater the correspondence between the saved characteristics and the newly determined properties of the current and/or voltage curve, the smaller the value at the output of the addition unit 33. In the trip unit 4, the output signal of the addition unit 33 is reviewed with regard to whether it falls short of a specifiable and saved comparison value. If the output signal of the addition unit 33 falls short of the comparison value, the occurrence of an unsafe electric arc is assumed, whereupon the trip unit 4 initiates the opening of the isolating contacts.

It can be envisaged that only one single device pursuant to one of the aforementioned embodiments is implemented in an electric arc detector 35 or in an electric arc circuit breaker 36. However, a greater, specifiable number of such devices can also be envisaged for every electric arc detector 35 or electric arc circuit breaker 36. In each such case, a different characteristic or a particular frequency band can be envisaged in each case.

Furthermore, it can be intended that the electric arc sensor 35 be adapted not just with regard to detecting unsafe electric arcs, but also—in accordance with the aforementioned method—such that the electric arc sensor 35 be able to detect loads within the electrical installation system, which can lead to false tripping based on experience, for instance, welding machines, or large electric motors with brushes. In doing so, it can be intended that the electric arc sensor 35 at least be adapted to the load in one of the aforementioned ways, wherein the characteristics thus determined be saved in a separate storage medium or appropriately marked such that when they are fulfilled by the properties of a current and/or voltage curve recorded subsequently, no tripping of the isolating or switch contacts 37 is initiated.

Beside the sole description of the determination of at least one characteristic, as given until now, as well as the additional review of subsequently determined current and/or voltage curves for the fulfilment of at least one characteristic, it is also preferably intended that at least one characteristic be recorded in at least one first mathematical algorithm. In doing so, it is particularly intended that the—at least one—characteristic have the form of a—particularly complex—number, and that the concerned characteristic be assigned at least one mathematical factor in the first mathematical algorithm. Here, it is intended that the current and/or voltage curves determined during the monitoring of the electrical installation system according to the first algorithm be evaluated, and the result or property thus determined be monitored by the trip unit 4.

During the method described until now and its implementation, a current and/or voltage curve is reviewed for the fulfilment of at least one characteristic is reviewed during the monitoring of the electrical installation system. As described, this can include multiple, especially parallel, implementation of the arrangement in question. However, it can also be intended that groups of different characteristics, especially groups of mean characteristic values, be saved in a library. Similarly, different algorithms can be saved in such a library. Such a library is preferably arranged in the region of the computing and/or storage unit 8.

In this regard, it is preferably intended that when monitoring the electrical installation system, the characteristic or the algorithm be selected from a specifiable number of saved characteristics or algorithms.

The selection of a characteristic or algorithm thus described can thus be envisaged for each of the described designs of an electric arc sensor 35, electric arc circuit breaker 36 or an appropriate method for operating such devices.

With regard to the selection of a specific characteristic or algorithm from the specifiable number of saved characteristics or algorithms, any type of such selection methods can be envisaged. Three preferred selection methods are described below with the help of FIGS. 3 to 5.

Figure 3:
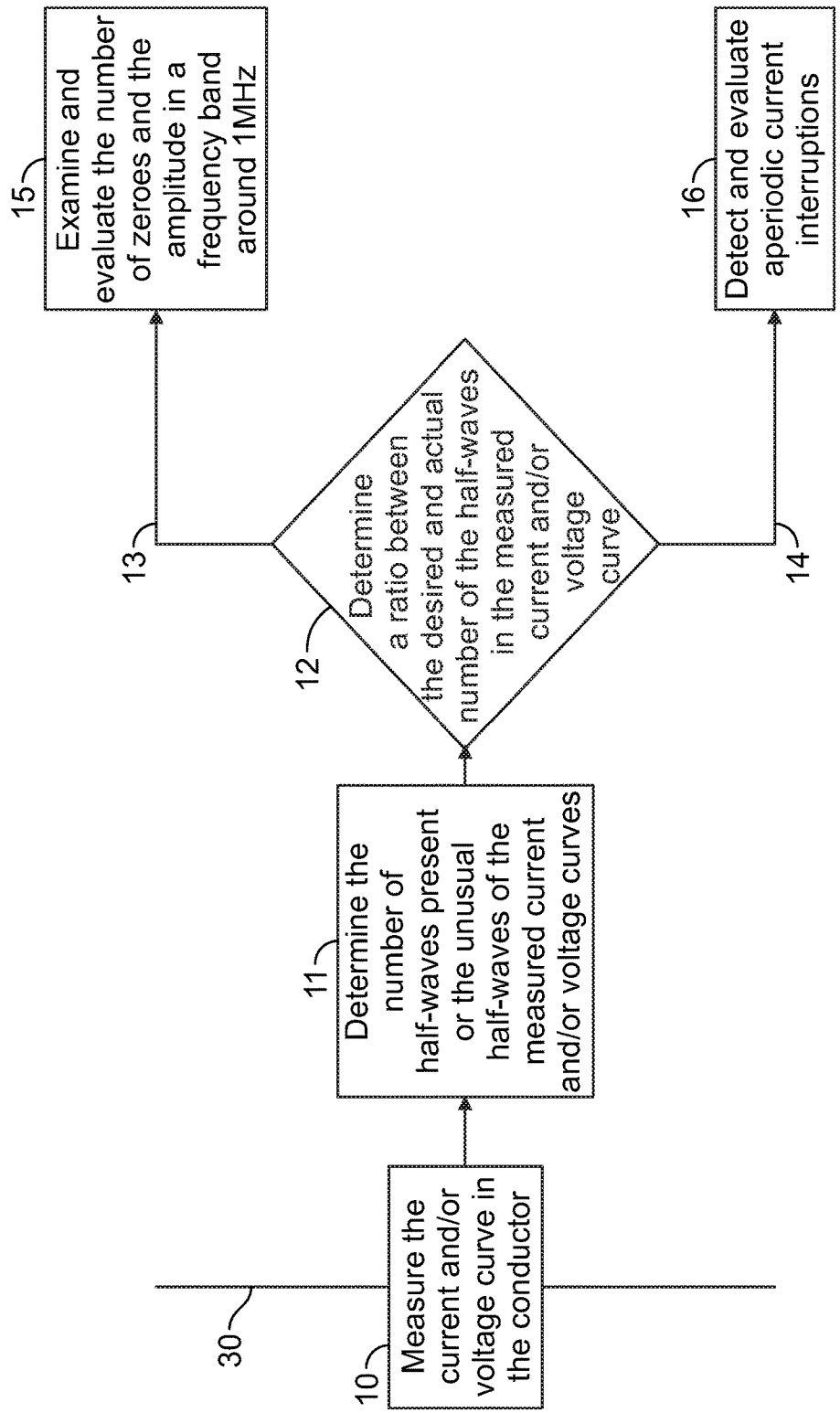
FIG. 3 a structure chart of a first method for selecting a characteristic or algorithm.

According to a first preferred method for selecting a characteristic or algorithm, it is intended that the number of occurring or unusual half-waves be ascertained for selecting the characteristic or the algorithm. FIG. 3 shows a structure chart of such a first method.

This involves measuring the current and/or voltage curve in the conductor 30 in a first step 10. In another step 11, the number of half-waves present or the unusual half-waves of the measured current and/or voltage curves is determined. Subsequently in step 12, a ratio between the desired and actual number of the half-waves in the measured current and/or voltage curve is determined. Should it be found that the ratio of the half-waves of the measured current and/or voltage curve is 2:2, a first algorithm 15 is selected in path 13, for which the number of zeroes and the amplitude in a frequency band around 1 MHz is examined and evaluated. Should it be found that the ratio of the half-waves of the measured current and/or voltage curve is not 2:2, and is, for instance, 2:1 or 2:0, a second algorithm 16 is selected in path 14; the second algorithm is adjusted to detect and evaluate aperiodic current interruptions.

Figure 4:
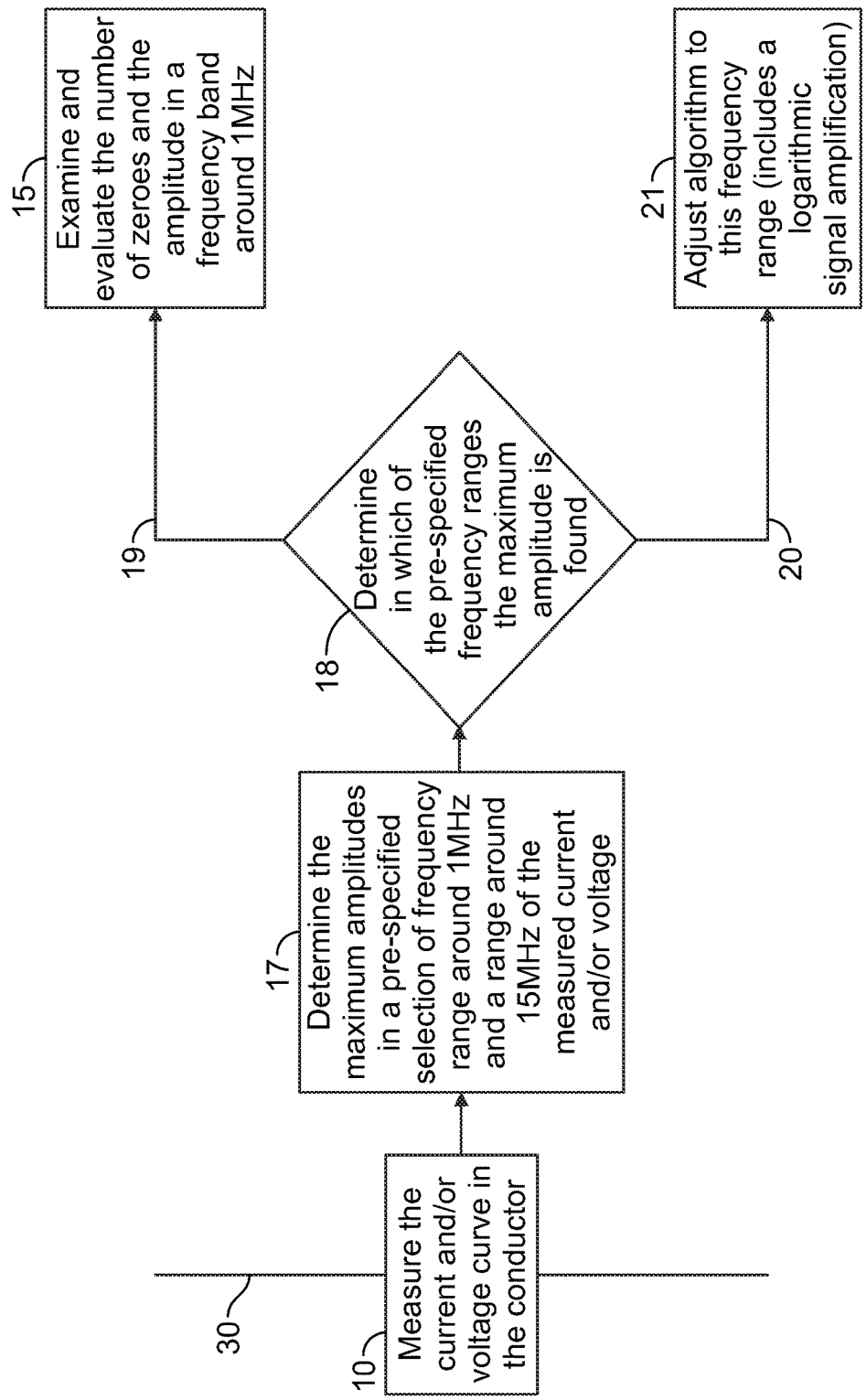
FIG. 4 a structure chart of a second method for selecting a characteristic or algorithm.

According to a second preferred method for selecting a characteristic or algorithm, it is intended that for selecting the characteristic or algorithm, a first amplitude in a first frequency band, and a second amplitude in a second frequency band be ascertained, and that the first amplitude be compared with the second amplitude. FIG. 4 shows a structure chart of such a second method.

This involves measuring the current and/or voltage curve in the conductor 30 in a first step 10. In another step 17, the maximum amplitudes in a pre-specified selection of frequency ranges, say a range around 1 MHz and a range of 15 MHz of the measured current and/or voltage curve are determined. Subsequently, in step 18, it is determined in which of the pre-specified frequency ranges the maximum amplitude is found. Should it be found that the maximum amplitude is found around 1 MHz, a first algorithm 15 is selected in path 19, for which the number of zeroes and the amplitude in a frequency band around 1 MHz is examined and evaluated. Should it be found that the maximum amplitude is found in the frequency range around 15 MHz, a third algorithm 21 is selected in path 20; the third algorithm is adjusted to this frequency range and includes, say, a logarithmic signal amplification.

Figure 5:
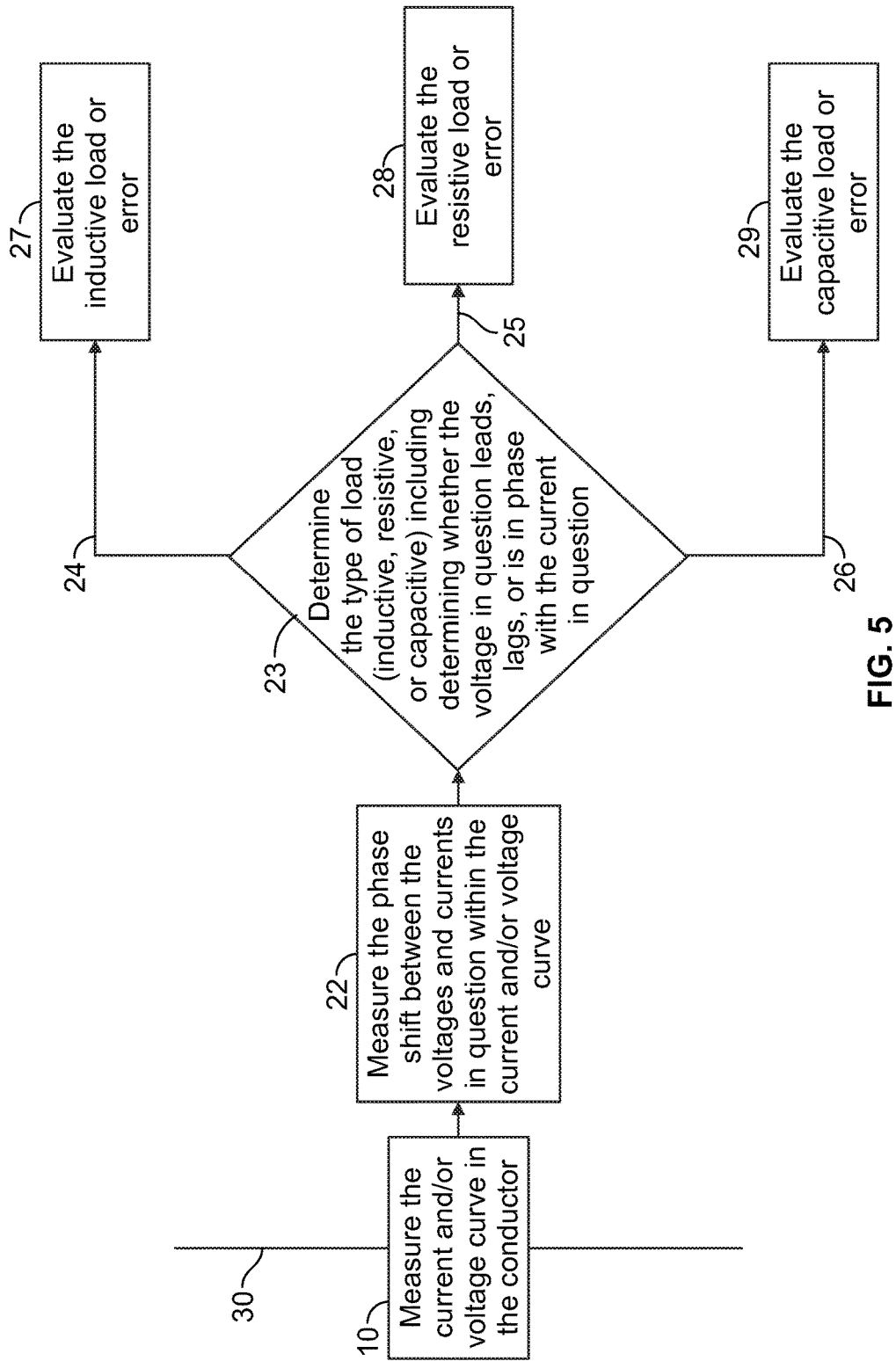
FIG. 5 a structural chart of a third method for selecting a characteristic or algorithm.

According to a third preferred method for selecting a characteristic or algorithm, it is intended that for selecting a characteristic or algorithm, a phase shift between a current curve and a voltage curve be ascertained. FIG. 5 shows a structure chart of such a third method.

This involves measuring the current and/or voltage curve in the conductor 30 in a first step 10. In another step 22, a phase shift between the voltages and currents in question within the current and/or voltage curve is measured. Subsequently, in step 23, the type of load is determined as to whether it is—in particular—an inductive, resistive or capacitive load. For this purpose, it is determined whether the voltage in question leads, lags or is in phase with the current in question.

Should it be found that the voltage leads the current, it is an inductive load, and the fourth algorithm 27 is selected in path 24, which is adapted to evaluate the inductive load or error.

Should it be found that the voltage is in phase with the current, it is a resistive load, and the fifth algorithm 28 is selected in path 25, which is adapted to evaluate the resistive load or error.

Should it be found that the voltage lags the current, it is a capacitive load, and the sixth algorithm 29 is selected in path 26, which is adapted to evaluate the capacitive load or error.

Preferably, selection from among all the preferably shown algorithms can also be envisaged. Furthermore, selection within a considerable number of algorithms can also be envisaged.

Other embodiments as per the invention only show a part of the features described, though every combination of features, in particular of the various embodiments described, is possible.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for adapting an electric arc sensor at a position in an electrical installation system and protecting the electrical installation system from electric arcs, the method comprising:
   at least one of simulating and generating a specifiable number of specifiable electric arcs at a first position in the electrical installation system, the electrical installation system comprising:
      at least one conductor;
      a first data logging unit connected to the at least one conductor;
      a first transform unit connected to the first data logging unit;
      a computing and/or storage unit connected to the first transform unit;
      a second data logging unit arranged in the at least one conductor, the second data logging unit including a second transform unit; and
      an addition unit,
   recording, in the first data logging unit, each simulated or generated electric arc in at least one first curve that is at least one of a current curve and voltage curve;
   determining and saving at least one characteristic of the at least one first curve in the computing and/or storage unit and supplying the same to the addition unit;
   outputting at least one second curve that is at least one of a current curve and a voltage curve recorded by the second data logging unit and processed by the second transform unit to the addition unit; and
   generating, using the addition unit, a convergence between the at least one characteristic and at least one property of the at least one second curve outputted by the second data logging unit.

2. The method according to claim 1, wherein the at least one characteristic is determined by analyzing the at least one curve in a specifiable manner in at least one of a time range and an image range.

3. The method according to claim 1, wherein the at least one characteristic is determined by analyzing the at least one curve in a specifiable manner in a frequency range.

4. The method according to claim 1, wherein the at least one characteristic includes at least one specifiable part of at least one of a time curve and an envelope curve of the time curve of the at least one curve.

5. The method according to claim 1, wherein the at least one characteristic includes a plurality of unusual half-curves of the at least one curve.

6. The method according to claim 1, wherein the at least one characteristic includes at least one specifiable part of at least one of a frequency spectrum and an envelope curve of the frequency spectrum of the at least one curve.

7. The method according to claim 1, wherein the at least one characteristic includes an amplitude value in a specifiable frequency band.

8. The method according to claim 1, wherein the at least one characteristic includes a phase shift of the at least one curve.

9. The method according to claim 1, further comprising determining at least one of a mean value and a standard deviation from a specifiable number of the characteristics.

10. The method according to claim 1, wherein the at least one curve is recorded at one point of the electrical installation system.

11. The method according to claim 1, further comprising setting an adaptive filter with the at least one characteristic.

12. The method according to claim 11, wherein the adaptive filter is set with a mean value of a specifiable number of the curves.

13. The method according to claim 1, wherein groups of mean characteristic values are saved in a library.

14. The method according to claim 1, wherein the at least one characteristic is recorded in at least one first mathematical algorithm.

15. The method according to claim 1, further comprising:
shutting down at least a part of the electrical installation system based on the convergence reaching a specified threshold value.

16. The method according to claim 15, wherein the at least one characteristic is selected in a specifiable manner from a specifiable number of saved characteristics or algorithms.

17. The method according to claim 15, further comprising selecting the at least one characteristic by ascertaining a number of occurring or unusual half-waves.

18. The method according to claim 15, further comprising selecting the at least one characteristic by ascertaining a first amplitude in a first frequency band and a second amplitude in a second frequency band such that the first amplitude is comparable with the second amplitude.

19. The method according to claim 15, further comprising selecting the at least one characteristic by ascertaining a phase shift between a current curve and a voltage curve.

20. An electric arc circuit breaker, comprising:
a switching contact configured to provide a specifiable interruption of an electrical connection within an electrical installation system; and
an electrical circuit arrangement including a microcontroller configured to carry out the method according to claim 1, the circuit arrangement being operatively connected, at least indirectly, with the switching contact.

* * * * *